(12) United States Patent
Lee et al.

(10) Patent No.: US 9,842,035 B2
(45) Date of Patent: Dec. 12, 2017

(54) SEMICONDUCTOR SYSTEM INCLUDING REPLACEMENT STORAGE UNIT

(71) Applicant: SK hynix Inc., Gyeonggi-do (KR)

(72) Inventors: Kyung-Min Lee, Gyeonggi-do (KR);
Young-Ook Song, Gyeonggi-do (KR);
Ki-Joong Kim, Gyeonggi-do (KR);
Yong-Ju Kim, Gyeonggi-do (KR);
Jung-Hyun Kwon, Gyeonggi-do (KR);
Sang-Gu Jo, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/236,287

(22) Filed: Aug. 12, 2016

(65) Prior Publication Data

US 2017/0277606 A1    Sep. 28, 2017

(30) Foreign Application Priority Data

Mar. 24, 2016  (KR) .................. 10-2016-0035039

(51) Int. Cl.
| | | |
|---|---|---|
| *G11C 16/04* | (2006.01) | |
| *G06F 11/20* | (2006.01) | |
| *G11C 5/02* | (2006.01) | |
| *H01L 25/065* | (2006.01) | |

(52) U.S. Cl.
CPC ...... *G06F 11/2017* (2013.01); *G06F 11/2094* (2013.01); *G11C 5/025* (2013.01); *H01L 25/0657* (2013.01)

(58) Field of Classification Search
CPC .. G06F 11/2017; G06F 11/2094; G11C 5/025; H01L 25/0657
USPC ........................................................ 365/201
See application file for complete search history.

(56) References Cited

U.S. PATENT DOCUMENTS

| | | | |
|---|---|---|---|
| 8,583,870 B2 | 11/2013 | Jeddeloh | |
| 8,760,922 B2 * | 6/2014 | Lassa | G06F 3/0619 365/185.11 |
| 2013/0265825 A1 * | 10/2013 | Lassa | G06F 3/0619 365/185.11 |
| 2014/0181417 A1 | 6/2014 | Loh et al. | |

* cited by examiner

*Primary Examiner* — Richard Elms
*Assistant Examiner* — Xiaochun L Chen
(74) *Attorney, Agent, or Firm* — IP & T Group LLP (57) ABSTRACT

A semiconductor system includes one or more core chips including a plurality of memory banks; one or more replacement storage units; and a base chip suitable for: first detecting a memory bank having an access frequency that satisfies a first condition, second detecting whether an utilization rate of the first detected memory bank satisfies a second condition, and replacing the second detected memory bank with one among the replacement storage units.

25 Claims, 9 Drawing Sheets

SEMICONDUCTOR SYSTEM INCLUDING REPLACEMENT STORAGE UNIT

CROSS-REFERENCE TO RELATED APPLICATION

This application claims priority under 35 U.S.C. §119(a) to Korean Patent Application No. 10-2016-0035039 filed on Mar. 24, 2016 in the Korean Intellectual Property Office, the disclosure of which is incorporated herein by reference in its entirety.

TECHNICAL FIELD

This patent document relates generally to semiconductor systems and a method of operating the same.

BACKGROUND

A semiconductor package includes a plurality of chips which are stacked with each other. Generally, a base chip which is the lowermost chip of the stacked chips may serve to perform external communication with the rest chips (hereinafter, referred to as core chips). The base chip may generate a control signal for controlling a plurality of core chips in response to a command received the like from an external device, and transmit the control signal to each core chip through a through silicon via (TSV). The control signal may be, for example, a control signal for an active operation, a precharge operation, a refresh operation, a read operation and a write operation.

Each core chip may include a plurality of memory banks, and each memory bank may include a plurality of word lines. Accessing or refreshing a memory bank consumes a lot of power. As the number of memory banks included in each core chip is increased, the power consumed for generating a control signal, and transmitting the control signal to each core chip, and active-precharging a word line is inevitably increased.

SUMMARY

The present invention provides a semiconductor system and an operation method thereof exhibiting reduced power consumption.

The disclosed technology in this patent document includes a semiconductor system and an operation method of the semiconductor system which reduces power consumption by setting a channel that all included memory banks are replaced to a power down mode.

In an embodiment, a semiconductor system may include one or more core chips including a plurality of memory banks; one or more replacement storage units; and a base chip suitable for: first detecting a memory bank having an access frequency that satisfies a first condition, second detecting whether an utilization rate of the first detected memory bank satisfies a second condition, and replacing the second detected memory bank with one among the replacement storage units.

In an embodiment, A method of operating a semiconductor system includes: detecting a first memory bank having an access frequency that satisfies a first condition in one or more core hips including a plurality of memory banks, and of which an utilization rate satisfies a second condition in the plurality of memory banks, by a base chip connected to the core chips; and replacing the first memory bank with one or more replacement storage units, wherein the base chip is for controlling data of the first memory bank to be transmitted to and stored in the replacement storage units.

BRIEF DESCRIPTION OF THE DRAWINGS

The above and other features and advantages of the present invention will become more apparent to those skilled in the art to which the present invention belongs by describing in detail various embodiments thereof with reference to the attached drawings in which.

DETAILED DESCRIPTION

Various embodiments will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the present invention to those skilled in the art.

Throughout the disclosure, like reference numerals refer to like parts throughout the various figures and embodiments of the present invention.

It will be understood that, although the terms "first", "second", "third", and the like may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to more clearly illustrate the various elements of the embodiments. For example, in the drawings, the size of elements and the intervals between elements may be exaggerated compared to actual sizes and intervals for convenience of illustration.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention.

As used herein, singular forms are intended to include the plural forms as well, unless the context clearly indicates otherwise.

It will be further understood that the terms "comprises", "comprising", "includes", and "including" when used in this specification, specify the presence of the stated elements and do not preclude the presence or addition of one or more other elements.

As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless specifically indicated otherwise.

Hereinafter, the various embodiments of the present invention will be described in detail with reference to the attached drawings.

Figure 1:
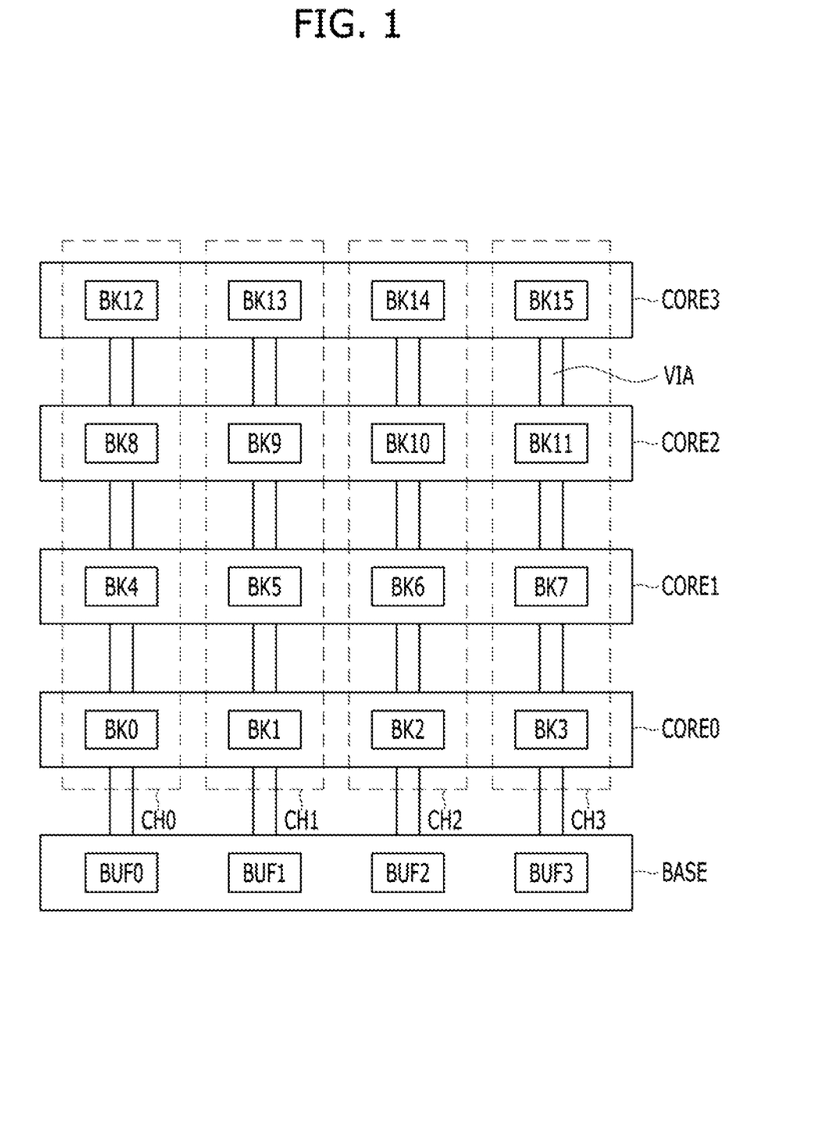
FIG. 1 is simplified configuration, diagram illustrating a semiconductor system, in accordance with an embodiment of the present invention.

Referring now to FIG. 1 is a simplified configuration diagram of a semiconductor system is provided, according to an embodiment of the present invention. FIG. 1 illustrates the semiconductor system in which a plurality of replacement storage units BUF0 to BUF3 are included in a base chip BASE.

Referring to FIG. 1, the semiconductor system may include a plurality of chips, a base chip BASE and a plurality of core chips CORE0 to CORE3. The plurality of core chips CORE0 to CORE3 are sequentially stacked on the base chip BASE in the recited order to form a stacked structure.

The plurality of core chips CORE0 to CORE3 may exchange signals with the base chip BASE through a plurality of vias VIA. The signals which are exchanged between the core chips CORE0 to CORE3 and the base chip BASE may include control signals and data for controlling an operation of the core chips CORE0 to CORE3. The plurality of core chips CORE0 to CORE3 may include any one of a volatile memory, such as a dynamic random access memory (DRAM), a mobile DRAM, a static random access memory (SRAM) and the like, or a non-volatile memory, such as a read only memory (ROM), a NOR flash memory, a NAND flash memory, a phase change random access memory (PRAM), a resistive random access memory (RRAM), a spin transfer torque random access memory (STTRAM), a magnetic random access memory (MRAM) and the like, or various circuits which may store the data by performing the function similar thereto. In an embodiment the plurality of core chips CORE0 to CORE3 may be a DRAM.

Each of the plurality of core chips CORE0 to CORE3 may include a plurality of memory banks BK0 to BK15. Each of the plurality of memory banks BK0 to BK15 may include a plurality of memory cells (not shown). Each of the plurality of memory banks BK0 to BK15 may perform an active operation, a precharge operation, a refresh operation, and a write operation or a read operation according to an access command received from an external device.

The base chip BASE may control the memory banks BK0 to BK15 which are included in each of the core chips CORE0 to CORE3 in response to an access command, and may transmit data between the core chips CORE0 to CORE3 and the external device.

For example, the data which is received from an external device (positioned outside of the semiconductor system) in a write operation is transmitted to at least one of the memory banks BK0 to BK15 in the core chips CORE0 to CORE3 through the base chip BASE. Also, a data output from at least one of the memory banks BK0 to BK15 of the core chips CORE0 to CORE3 in a read operation is transmitted to the external device outside of the semiconductor system through the base chip BASE.

The access command may include at least one of an active command, a refresh command, a precharge command, a read command and a write command. The active command may be a command for activating a word line included in a memory bank. The precharge command may be A command for precharging the activated word line. The refresh command may be a command for refreshing the word line to be active-precharged. The write command may be a command for writing the data in a selected memory bank. The read command may be a command for reading the data from the selected memory bank.

The base chip BASE may include a plurality of replacement storage units BUF0 to BUF3, Each of the plurality of replacement storage units BUF0 to BUF3 may be a circuit which replaces at least one memory bank selected from the plurality of memory banks BK0 to BK3 having a utilization rate that is less than a first utilization threshold rate. For example, each of the replacement storage units BUF0 to BUF3 may be a data buffer having a data storage function. However, each of the replacement storage units BUF0 to BUF3 is not limited to being only a data buffer. For example, each of the replacement storage units BUF0 to BUF3 may be a volatile memory circuit, such as a dynamic random access memory (DRAM), a mobile DRAM, a static random access memory (SRAM) and the like, or a non-volatile memory circuit, such as a read only memory (ROM), a NOR flash memory, a NAND flash memory, a phase change random access memory (PRAM), a resistive random access memory (RRAM), a spin transfer torque random access memory (STTRAM), a magnetic random access memory (MRAM) and the like, or various circuits which may store the data by performing a function similar thereto. In an exemplary embodiment, the replacement storage units BUF0 to BUF3 may include a DRAM. The replacement storage units BUF0 to BUF3 may be designed to have storage capacity greater than, equal to, or less than the storage capacity of each of the memory banks BK0 to BK15.

The utilization rate will be described later with reference to FIG. 3.

The base chip BASE may first detect a memory bank having an access frequency that satisfies a first condition (hereinafter referred to also as a first detected memory bank)

second detect whether or not the utilization rate of the first detected memory bank satisfies a second condition, and use a replacement storage unit among the plurality of storage units BUF0 to BUF3 which corresponds to a memory bank that satisfies both the first and second conditions (hereinafter referred to also as a second detected memory bank) for replacing the second detected memory bank with the corresponding replacement storage unit. The base chip BASE may monitor whether or not, the plurality of memory banks BK0 to BK15 are accessed, and first detect the memory bank (for example, BK0) which satisfies the first condition among the plurality of memory banks BK0 to BK15 with reference to a monitoring result. When the utilization rate of the first detected memory bank satisfies the second condition by monitoring the utilization rate of the first detected memory bank (for example BK0) the base chip BASE may then define that bank as a second detected bank (for example the memory bank BK0) and control the data of the second detected memory bank (for example BK0) to be transmitted to and stored in a corresponding replacement storage unit (for example, BUF0 which corresponds to the second detected memory bank BK0).

Continuing with the example wherein the memory bank BK0 is the second detected memory bank, when, after the entire data of the second memory bank BK0 is transmitted to and stored in the corresponding replacement storage unit BUF0, the base chip BASE may access the replacement storage unit BUF0 in response to the access command corresponding to the memory bank BK0, or interrupt the access command corresponding to the memory bank BK0 so that the operation corresponding to the access command is not performed. Hereinafter, the second detected memory bank which is completely replaced with the replacement storage unit may also be referred to as a replacement-target bank. Hence, in the aforementioned example, wherein the memory bank BK0 satisfied both the first and second conditions, the memory bank BK0 is a replacement-target bank.

When an access command is inputted, the base chip BASE may generate control signals for performing the access command and transmit the control signals to a set memory bank unless, when the set memory bank is a replacement-target bank.

For example, when the memory bank BK0 is identified as a replacement-target bank if at least one of an active, precharge and refresh commands corresponding to the memory bank BK0 is received, the base chip BASE may then interrupt the command corresponding to the memory bank BK0 so that the operation corresponding to the command is not performed. When a write command corresponding to the memory bank BK0 (which has been identified as a replacement-target bank) is received, the base chip BASE may write the data in the replacement storage unit. BUF0. When a read command corresponding to the memory bank BK0 (which has been identified as a replacement-target bank) is received, the base chip BASE may read and output the data of the replacement storage unit BUF0.

setsetWhen the detected memory bank in which the first condition is satisfied (for example, BK1) is the replacement-target bank as the replacement storage unit (for example, BUF1), and the utilization rate of the first-detected memory bank BK1 satisfies a third condition, the base chip BASE may third-detect the memory bank BK1 and control the data of the replacement storage unit BUF1 to be transmitted to and stored in the third-detected the replacement-target bank BK1.

Hereinafter, in the above-described process, the operation in which the data of a second detected memory bank is transmitted to and stored in the replacement storage unit is referred to as a replacement operation. Also, the operation in which the data of the replacement storage unit is transmitted to and stored in the third-detected replacement-target bank is referred to as a restoration operation. The operation of the memory system in which an access command to a memory bank is inputted during a replacement operation and a restoration operation will be described later in reference to FIGS. 4A to 5C.

The plurality of memory banks BK0 to BK3 may be included in one channel of a plurality of channels CH0 to CH3 which are independently controlled. So for example, as illustrated in FIG. 1, the memory banks BK0, BK4, BK8 and BK12 may be included in the channel CH0, the memory banks BK1, BK5, BK9 and BK13 may be included in the channel CH1, the memory banks BK2, BK6, BK10 and BK14 may be included in the channel CH2, and the memory banks BK3, BK7, BK11 and BK15 may be included in the channel CH3.

The phrase "controlling independently" as used herein means that an access command is inputted separately for each channel, and that operation of one channel may not affect the operation of the remaining channels. Therefore, the same operation or different operations performed in the channels may be controlled to be performed simultaneously or at different times (e.g. sequentially).

When all the memory banks of one channel are replaced with replacement storage units, the base chip BASE may set the corresponding channel to the power down mode. For example, when all the memory banks BK0, BK4, BK8 and BK12 which are included in the channel CH0 are replaced with the replacement storage units BUF0 to BUF3, the channel CH0 may be set to the power down mode. The power down mode may minimize power consumption of the corresponding channel.

The utilization rate may be represented as a ratio of used storage capacity of the storage capacity in the replacement storage unit. The utilization rate may be represented as the value which is obtained by dividing the used storage capacity capacity by the total storage capacity in use.

In a channel wherein all the included memory banks are completely replaced and the power down mode is set, when one or more of the replacement-target banks are restored, the base chip BASE may terminate the power down mode of the corresponding channel.

The first condition may be the condition for performing the first detecting operation which detects the memory bank in which the utilization rate is to be monitored. The first condition may be, for example, a condition in which access frequency has to be greater than a reference access frequency (also referred to hereinafter as first condition 1-1). In another example, the first condition may be a condition in which the access frequency has to be less than a reference access frequency (also referred to hereinafter as first condition 1-2). That is, the memory bank which is first detected by the first condition may be a memory bank which is more often accessed than the reference access frequency or a memory bank which is less often accessed than the reference access frequency. The first condition may be selected as any one of the conditions (1-1) and (1-2) according to a design.

For example, the reference access frequency may be S1 times during a period of time T1. When the first condition is first condition 1-1, a memory bank which is accessed more than S1 times for the T1 time period may be first detected. Also, when the first condition is first condition 1-2, a memory bank which is accessed less than S1 times for the T1 time period may be first detected.

The second condition may be a condition for performing the second detecting operation which detects whether or not the first detected memory bank is a memory bank which is to be replaced with the replacement storage unit. The second condition may be a condition in which the utilization rate of the memory bank has to be greater than a replacement utilization threshold rate (hereinafter also referred to as second condition 2-1), or a condition in which the utilization rate of the memory bank has to be less than the replacement utilization threshold rate (hereinafter also referred to also as second condition 2-2). That is, the memory bank which is second detected by the second condition may be a memory bank which is more used than the replacement utilization threshold rate or a memory bank which is less used than the replacement utilization threshold rate. The second condition may be selected as any one of the second conditions 2-1 and 2-2 according to the design.

For example, it may be assumed that the replacement utilization threshold rate means that a third of word lines among total word lines included in a memory bank is used. When the second condition is selected as the second condition 2-1, a memory bank in which word lines more than a third of the total word lines are used may be second detected and replaced with a replacement storage unit. When the second condition is selected as the second condition 2-2, a memory bank in which word lines less than a third of the total word lines are used may be second detected and replaced with a replacement storage unit.

The third condition may be a condition for performing the third detecting operation which detects whether or not the first detected replacement-target bank is a memory back which is to be restored. The third condition may be a condition in which the utilization rate has to be greater than a restoration utilization threshold rate (hereinafter also referred to as a third condition 3-1) or a condition in which the utilization rate has to be less than the restoration utilization threshold rate (hereinafter also referred to as a third condition 3-2). That is, a replacement-target bank which is third-detected by the third condition may be a memory bank which is more used than the restoration utilization threshold rate or a memory bank which is less used than the restoration utilization threshold rate. The third condition may be selected as any one of the third conditions 3-1 and 3-2 according to the design.

For example, it may be assumed that the restoration utilization threshold rate means that one half of the word lines included in a memory bank is used. When the selected third condition is third condition 3-1, a replacement-target bank in which word lines more than one half of the total word lines are used may be third-detected, and data in a replacement storage unit may be restored in the third-detected replacement-target bank. Also, when the selected third condition is the third condition 3-2, a replacement-target bank in which word lines less than one half of the total word lines are used may be third-detected, and data in a replacement storage unit may be restored in the third-detected replacement-target bank.

In the semiconductor system in FIG. 1, the base chip BASE may not necessarily generate and transmit the control signal for controlling the memory bank by replacing the memory bank with the replacement storage unit and use the replacement storage unit. Therefore, since the word line of a completely replaced memory bank does not need to activate, precharge or refresh, the power consumption may be reduced. In addition, when all the memory banks in one channel are completely replaced, the power consumption may be further reduced by setting the corresponding channel to the power down mode.

At this time, the memory bank which is to be replaced with the replacement storage unit may be selected according to various conditions. Also, the condition which restores the replacement-target bank may be changed according to design. For example, when the first condition is selected as the first condition 1-2, the second condition is selected as the second condition 2-2, and the third condition is selected as the third condition 3-1, the base chip may replace a memory bank having a low utilization rate among the memory banks having a low access frequency with a replacement storage unit, and when the utilization rate of the replacement-target bank is greater than a set reference, the base chip may restore the replacement-target bank. In another example, when the first condition is selected as the first condition 1-1, and the second condition is selected as the second condition 2-1, and the third condition is selected as the third condition 3-2, the base chip may replace a memory bank having a high utilization rate among the memory banks having a high access frequency with a replacement storage unit, and when the utilization rate of the replacement-target bank is less than the set reference, the base chip may restore the replacement-target bank. The first to third conditions may be selected by various other combinations in addition to the ones as described above.

FIG. 1 illustrates that the base chip BASE includes four replacement storage units BUF0 to BUF3, and each of the core chips CORE0 to CORE3 and the channels CH0 to CH3 include four memory banks, but the number of the replacement storage units included in the base chip BASE or the number of the memory banks included in the core chips CORE0 to CORE3 and the channels may be changed according to design.

Figure 2:
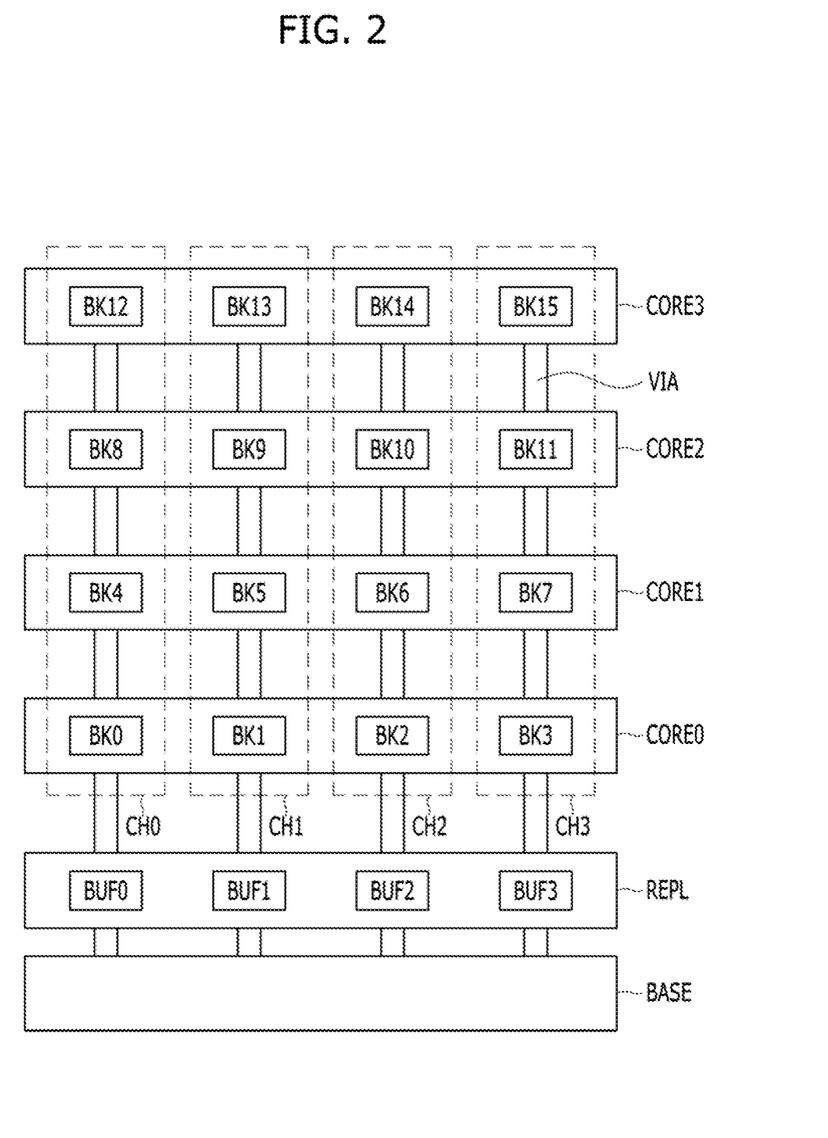
FIG. 2 is a simplified configuration diagram illustrating a semiconductor system, in accordance with an embodiment of the present invention.

FIG. 2 is a simplified configuration diagram illustrating a semiconductor system, in accordance with an embodiment of the present invention. FIG. 2 is a diagram illustrating a semiconductor system in which a plurality of replacement storage units BUF0 to BUF3 are included in a replacement chip REPL.

Referring to FIG. 2, the semiconductor system may include a plurality of chips, i.e., a base chip BASE, a replacement chip REPL and a plurality of core chips CORE0 to CORE3. The plurality of chips BASE, REPL and CORE0 to CORE3 are sequentially stacked to form a stacked structure.

A plurality of core chips CORE0 to CORE3 and the replacement chip REPL may exchange signals with a base chip BASE through vias VIA. The signals which are exchanged between core chips CORE0 to CORE3 and the replacement chip REPL, and the base chip BASE may include control signals and data for controlling an operation of the core chips CORE0 to CORE3 and the replacement chip REPL.

A configuration and an operation of the semiconductor system in FIG. 2 are substantially the same as the configuration and the operation of the semiconductor system in FIG. 1 except that the plurality of the replacement storage units BUF0 to BUF3 are included not in the base chip but in the replacement chip REPL. The replacement chip REPL may be an interposer.

In an exemplary embodiment, the semiconductor system may be a High Bandwidth Memory (HBM). The number of the vias VIA may be 1024 or more. The vias VIA may include a through silicon via (TSV), a conductive bump, or combinations thereof.

Figure 3:
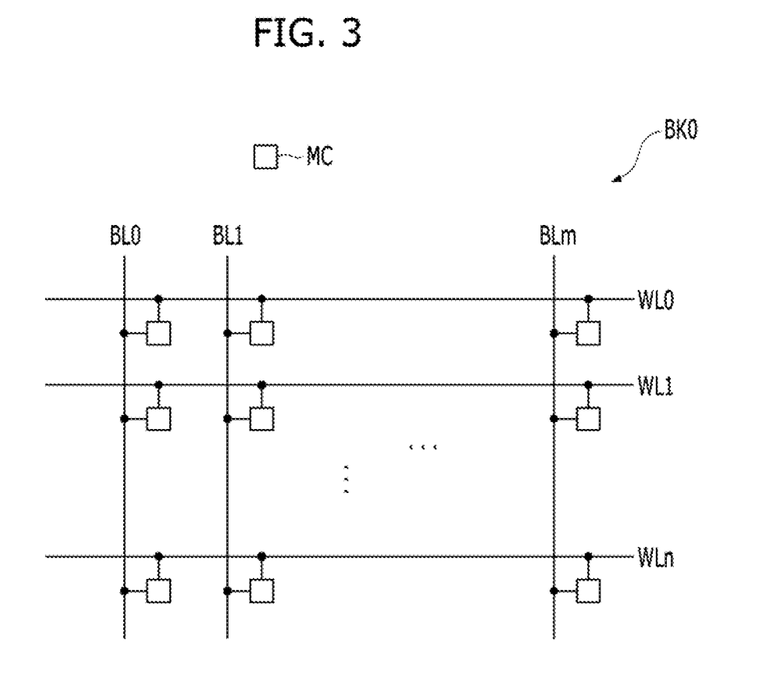
FIG. 3 is a diagram illustrating a conception of a utilization rate, in accordance with an embodiment of the present invention.

FIG. 3 is a diagram illustrating a conception of a utilization rate, in accordance with an embodiment of the present invention.

Referring to FIG. 3, a memory bank BK0 may include a plurality of word lines WL0 to WLn (n is a natural number), a plurality of bit lines BL0 to BLm (m is a natural number), and a plurality of memory cells MC.

A used state of a word line means a state wherein at least one memory cell of the plurality of memory cells MC coupled to the word line stores data. A non-used state of a word line means that all the memory cells MC coupled to the word line do not store data.

A utilization rate for a memory bank represents a ratio of the number of word lines in a used state over the total number of word lines WL0 to WLn in a memory bank, or a set ratio. The set ratio corresponding to the ratio of the word lines in a used state among all the word lines WL0 to WLn may not substantially mean the ratio between total word lines and the word line in a used state. The set ratio may be regarded as the same meaning as the ratio.

The base chip BASE may detect the utilization rate using an access command and an address. When the memory bank is not replaced, a result detected by the base chip BASE may represent the ratio of total word lines to the word lines substantially in a used state in the memory bank. When the memory bank is replaced, since data is not stored in the memory bank, the result detected by the base chip BASE may represent a ratio of total word lines to a word line in a used state when the memory bank is not replaced. Therefore, the utilization rate may define as described above.

For example, when the number of word lines in the used state (or in the used state) in the memory bank BK0 are k ($0 \leq k \leq n$) (k is a natural number equal to or greater than 0 and equal to or less than n), the utilization rate of the memory bank BK0 may be represented as k/n+1.

Figure 4A:
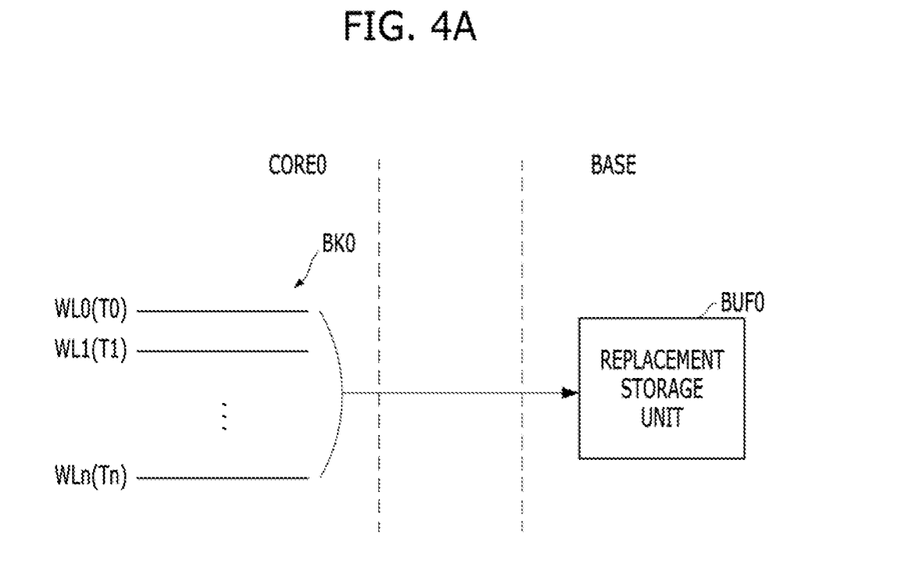
FIGS. 4A to 4C are diagrams illustrating a process of performing a replacement operation, in accordance with an embodiment of the present invention.
Figure 4B:
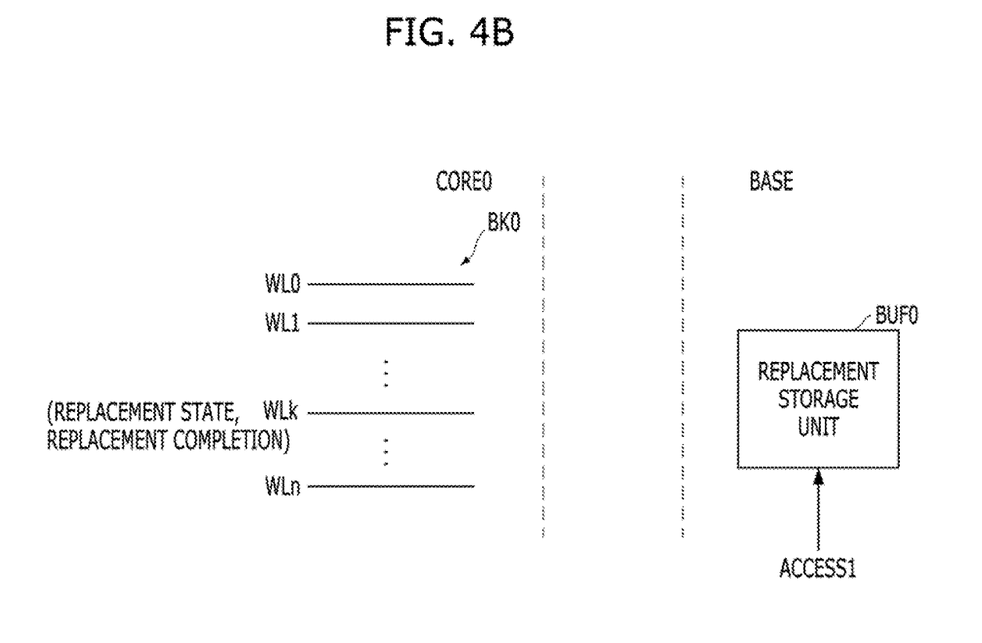
Figure 4C:
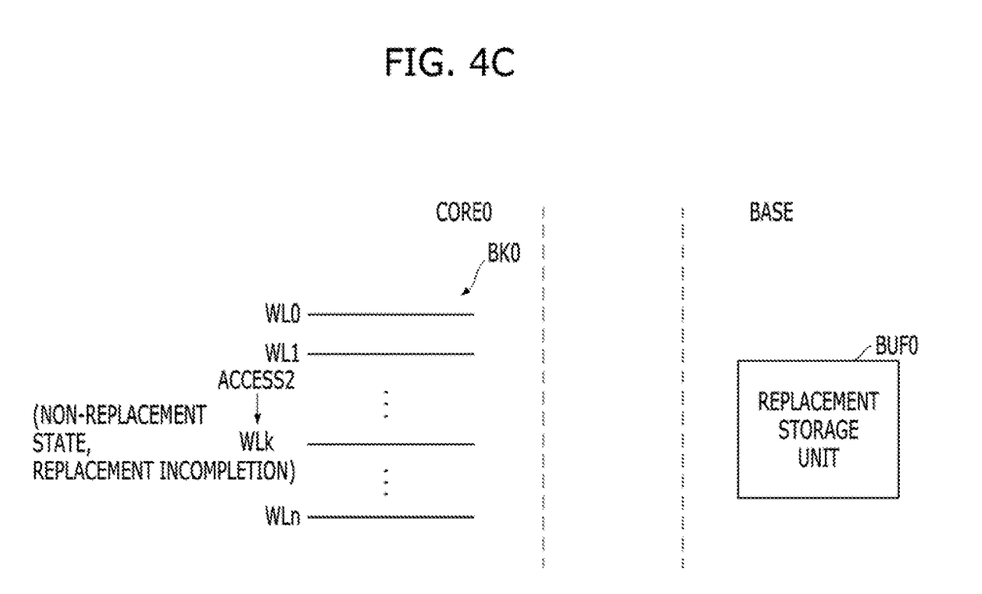

FIGS. 4A to 4C are diagrams illustrating process of performing a 'replacement operation' in accordance with an embodiment of the present invention. A process in which a memory bank BK0 is replaced with a replacement storage unit BUF0 will be described in FIGS. 4A to 4C. Only word lines WL0 to WLn of configurations of the memory bank BK0 are illustrated, and an illustration of the rest configurations (bit lines and memory cells) will be omitted in FIGS. 4A to 4C.

FIG. 4A is a diagram illustrating the process in which data in the memory bank BK0 is transmitted to the replacement storage unit BUF0.

When the data transmission to the replacement storage unit BUF0 starts in the memory bank BK0, a plurality of word lines WL0 to WLn in the memory bank BK0 may be sequentially selected, and data of the memory cells coupled to the selected word line may be transmitted to the replacement storage unit BUF0 (a zeroth transmission T0 to an n^th transmission Tn). During the transmission of the data of the memory bank BK0, when an access command corresponding to the memory bank BK0 is not input, the transmission of the data of the memory bank BK0 may be continuously performed from the beginning to the end.

However, since an access of the memory bank BK0 is not prohibited while the 'replacement operation' is performed, a command which accesses the memory bank BK0 may be input while the 'replacement operation' is performed.

The data transmission of the memory bank BK0 may be interrupted in a period (the period which writes or reads data) which accesses the memory bank BK0, and the 'replacement operation' may be continuously performed after the period which accesses the memory bank BK0 is terminated. However, the 'replacement operation' may be performed during a portion or all of a latency time (i.e., write latency) which is from a time that a write command is input to the time that the data to be written is input, and the latency time (i.e., read latency) which is from the time that a read command is input to the time that the read data is output (to be described later in FIG. 6).

An access operation will be separately described in FIGS. 4B and 4C, when the data of the word line which is an object of the access command is entirely stored in the replacement storage unit BUF0 (hereinafter, referred to as a replacement state), and when the data of the word line which is the object of the access command is not stored in the replacement storage unit BUF0 (hereinafter, referred to as a non-replacement state).

FIG. 4B is a diagram illustrating the access operation when the word line which is the object of the access command is in the replacement state (a replacement completion).

A word line (for example, WLk) which is an object of the access command, that is, when the word line WLk which is determined by an address is in the replacement state, the access command may be interrupted or the replacement storage unit BUF0 may be accessed other than the memory bank BK0 (ACCESS1). When the access command is an active command, a precharge command, or a refresh command, the access command may be interrupted. When the access command is the write command or the read command, data may be written in or read from a portion of the replacement storage unit BUF0 corresponding to the word line WLk other than the word line WLk of the memory bank BK0.

FIG. 4C is a diagram illustrating the access operation when the word line which is the object of the access command is in the non-replacement state (a replacement incompletion).

When the word line (for example, WLk) which is the object of the access command, that is, the word line WLk which is designated by an address is in the non-replacement state, the memory bank BK0 may be accessed. The access operation corresponding to the access command may be performed on the word line WLk (ACCESS2).

Figure 5A:
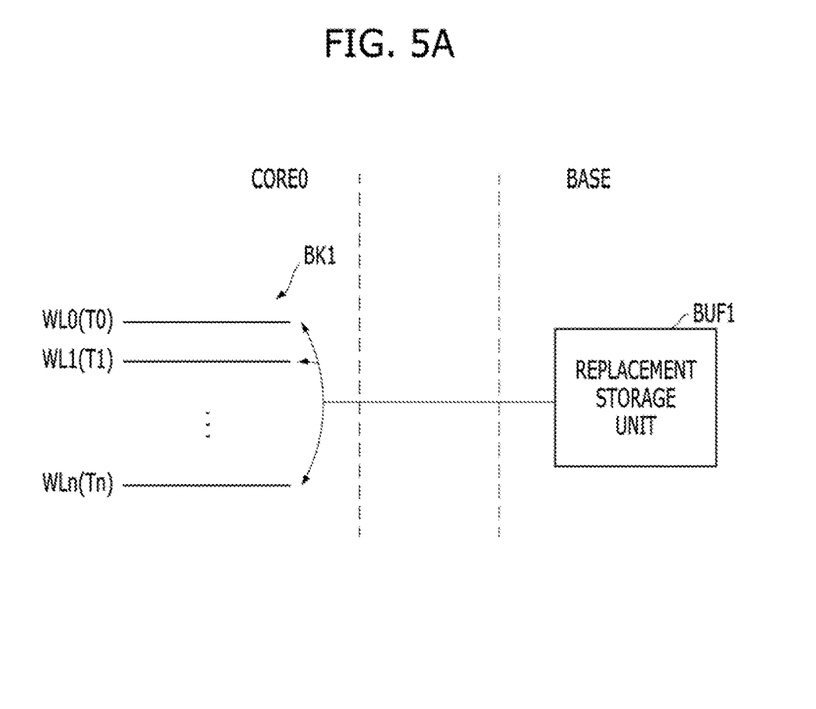
FIGS. 5A to 5C are diagrams illustrating process of performing a restoration operation, in accordance with an embodiment of the present invention.
Figure 5B:
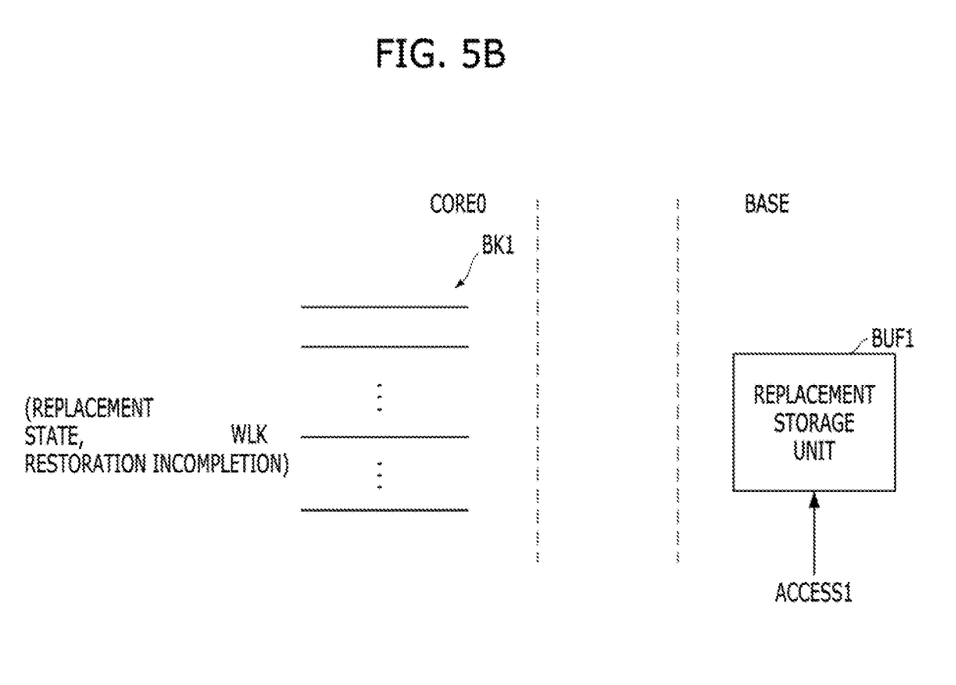
Figure 5C:
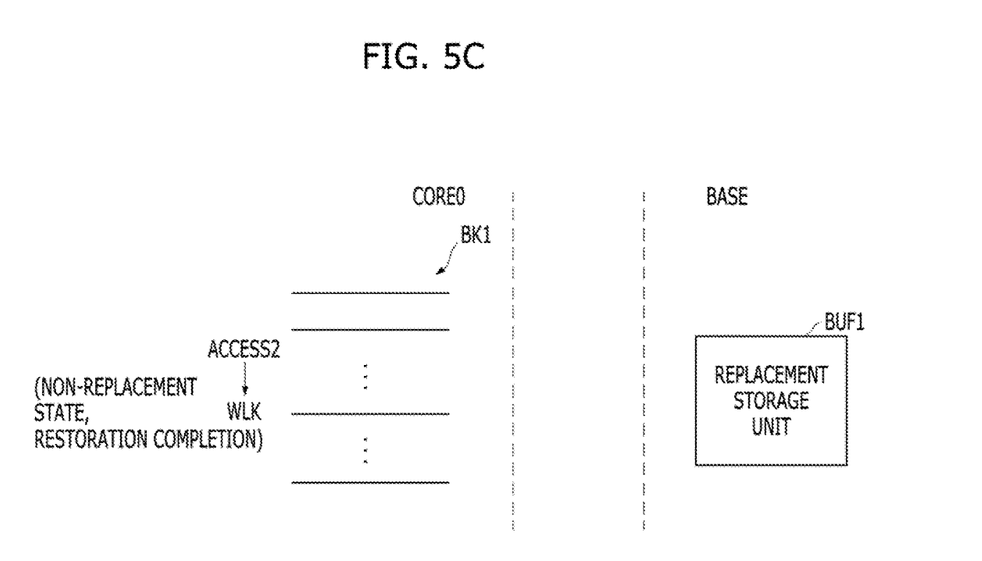

FIGS. 5A to 5C are diagrams illustrating a process of performing a 'restoration operation' in accordance with an embodiment of the present invention. A process in which data in a replacement storage unit BUF1 is restored to a memory bank BK1 will be described in FIGS. 5A to 5C.

FIG. 5A is a diagram illustrating the process in which data in the replacement storage unit BUF1 is transmitted to the memory bank BK1.

When the data transmission to the memory bank BK1 starts in the replacement storage unit BUF1, a plurality of word lines WL0 to WLn in the memory bank BK1 may be sequentially selected, and the data of the replacement storage unit BUF1 is transmitted to memory cells coupled to the selected word line (a zeroth transmission T0 to an n^th transmission Tn). While the data in the replacement storage unit BUF1 is transmitted, when an access command corresponding to the memory bank BK1 is not input, the transmission of data to the memory bank BK1 may be continuously performed from the beginning to the end.

However, since an access of the memory bank BK1 is not prohibited while the 'restoration operation' is performed, a command which accesses the memory bank BK1 may be input while the 'restoration operation' is performed. However, the 'restoration operation' may be performed during a portion or all of a latency time (i.e., write latency) which is from a time that a write command is input to the time that the data to be written is input, and the latency time (i.e., read latency) which is from the time that a read command is input to the time that the read data is output (to be described later in FIG. 6).

An access operation will be separately described in FIGS. 5B and 5C, when the data of the replacement storage unit BUF1 is not copied to the word line which is an object of the access command (a replacement state), and when the data of the replacement storage unit BUF1 is copied to the word line which is the object of the access command (a non-replacement).

FIG. 5B is a diagram illustrating the access operation when the word line which is the object of the access command is in the replacement state (a restoration incompletion).

A word line (for example, WLk) which is the object of the access command, that is, when the word line WLk which is designated by an address is in a non-restoration state, the access command may be interrupted or the replacement storage unit BUF1 may be accessed other than the memory bank BK1 (ACCESS1).

FIG. 5C is a diagram illustrating the access operation when the word line which is the object of the access command is in the non-replacement state (a restoration completion).

When the word line (for example, WLk) which is the object of the access command, that is, the word fine WLk which is designated by an address is in the restoration state, the memory bank BK1 may be accessed. The access operation corresponding to the access command may be performed on the word line WLk (ACCESS2).

Figure 6:
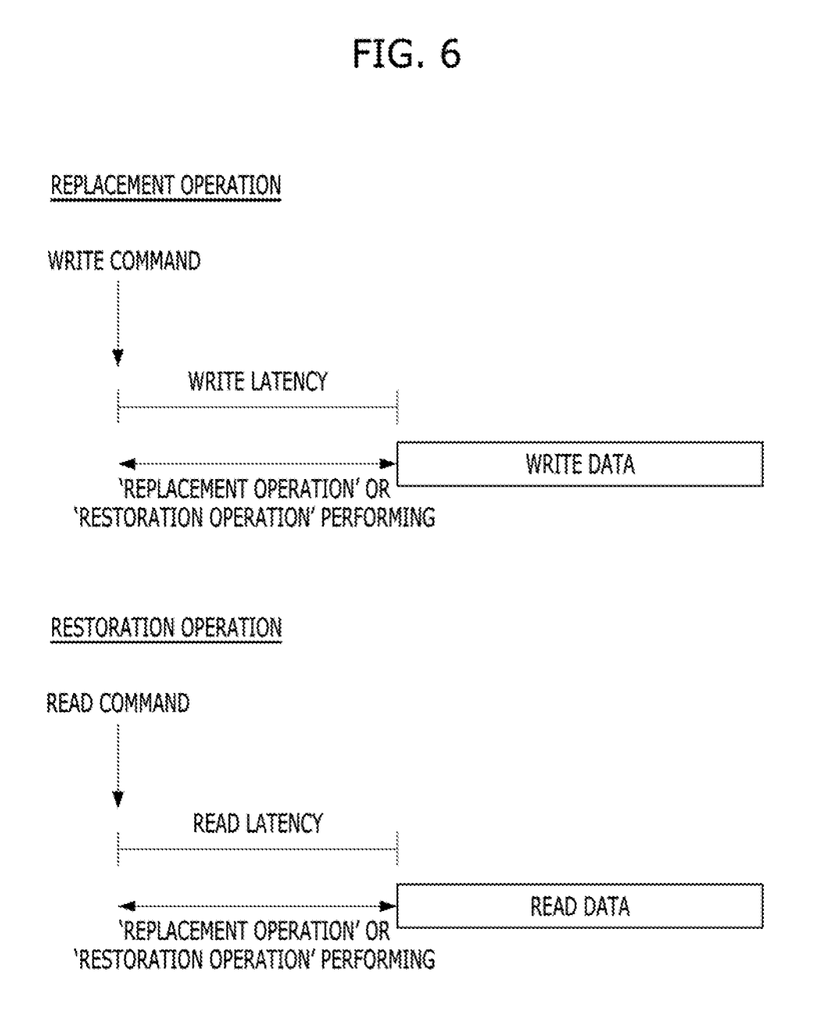
FIG. 6 is a diagram illustrating a replacement operation or a restoration operation performed during a latency time corresponding to an access command, in accordance with an embodiment of the present invention.

FIG. 6 is a diagram illustrating a 'replacement operation' or a 'restoration operation' performed during a latency time corresponding to an access command in accordance with an embodiment of the present invention.

Referring to FIG. 6, the replacement operation may represent that the 'replacement operation' or the 'restoration operation' is performed during the latency time of a write operation, and the restoration operation may represent that the 'replacement operation' or the 'restoration operation' is performed during the latency time of a read operation.

Figure 7:
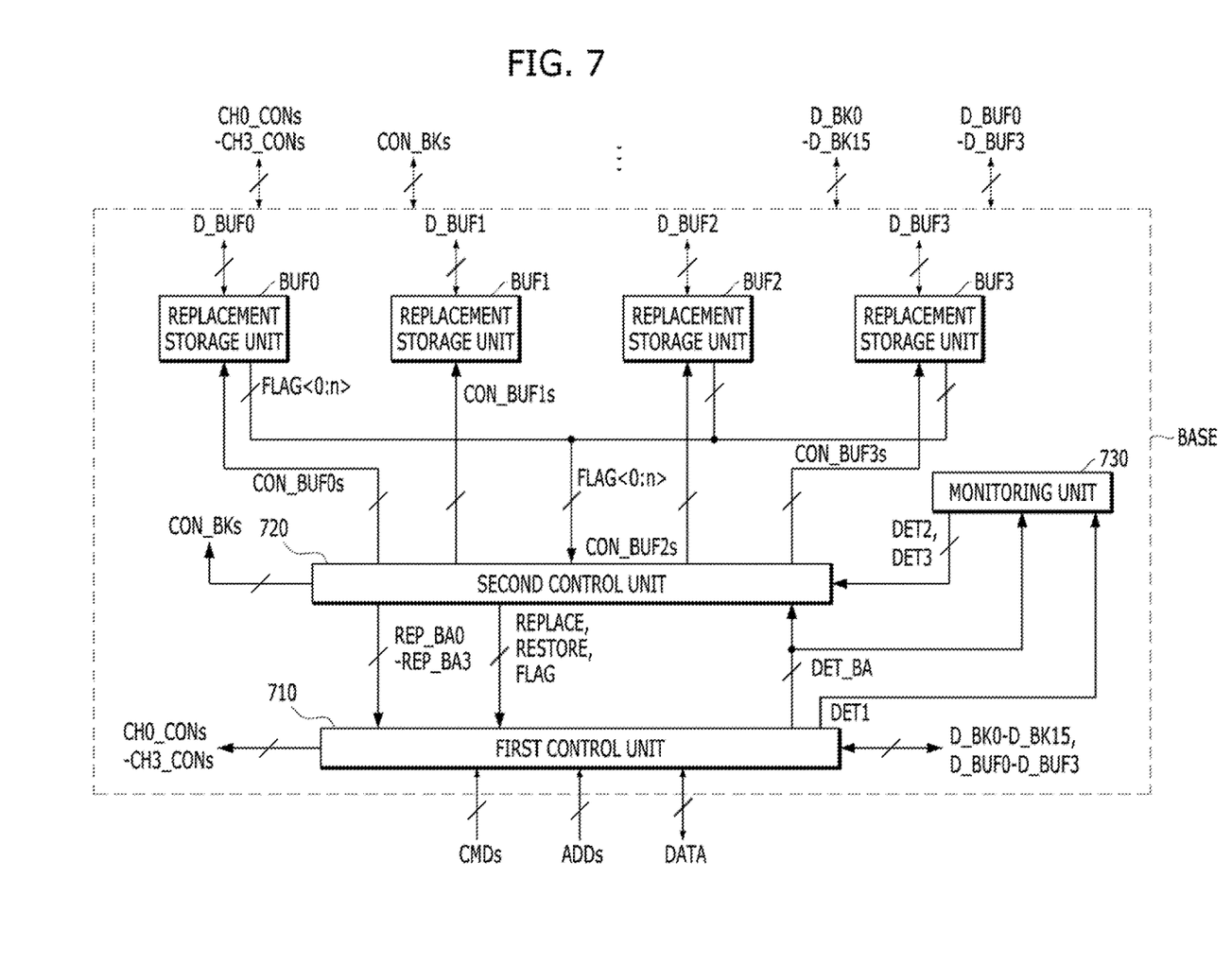
FIG. 7 is a simplified configuration diagram illustrating a base chip of the semiconductor system in FIG. 1.

FIG. 7 is a simplified configuration diagram illustrating a base chip BASE of the semiconductor system in FIG. 1.

Referring to FIG. 7, the base chip BASE may include a plurality of replacement storage units BUF0 to BUF3, a first control unit 710, a second control unit 720, and a monitoring unit 730.

The first control unit 710 may generate control signals CH0_CONs to CH3_CONs for controlling a selected channel by an address ADDs in response to an access command CMDs. The first control unit 710 may transmit the control signals CH0_CONs to CH3_CONs to a core chip which includes a memory bank selected by the address ADDs. The control signals CH0_CONs to CH3_CONs may include signals required for controlling an active operation, a precharge operation, a refresh operation, a write operation and a read operation of the memory bank included in each channel. At this time, the control signals for controlling the channels CH0 to CH3 may be independently generated.

The first control unit 710 may not generate the control signals CH0_CONs to CH3_CONs when one of replacement bank addresses REP_BA0 to REP_BA3 which are addresses of the memory bank which is replaced with the replacement storage unit and the address ADDs are the same. Also, the first control unit 710 may not generate the control signals CH0_CONs to CH3_CONs when a replacement signal REPLACE representing that an operation in which data of the memory bank is transmitted to and stored in a replacement storage unit is processing is activated, when a restore signal RESTORE representing that the operation in which the data stored in the replacement storage unit is transmitted to and stored in the memory bank is processing is activated, or when a flag signal FLAG is activated.

This is because the replacement storage unit is accessed other than the memory bank corresponding to the address ADDs when one of the replacement bank addresses REP_BA0 to REP_BA3 and the address ADDs are the same, when the replacement signal REPLACE and the flag signal FLAG are activated, or when the restore signal RESTORE and the flag signal FLAG are activated.

The first control unit 710 may detect whether or not the memory banks BK0 to BK15 are accessed in response to an access command CMDs, and first detect a memory bank which satisfies a first condition. After the memory bank which satisfies the first condition is detected, the first control unit 710 may activate a first detection signal DET1, and output a bank address DET_BA of the first detected memory bank.

In the write operation, the first control unit 710 may transmit the data DATA input from the outside of the semiconductor system to the memory bank selected by the address ADDs. Only when the memory bank selected by the address ADDs is a non-replacement bank, the first control unit 710 may transmit the input data DATA to the replacement storage unit.

In the read operation, the first control unit 710 may output the data DATA output from the memory bank selected by the address ADDs to the outside of the semiconductor system. Only when the memory bank selected by the address ADDs is replaced with the replacement storage unit, the first control unit 710 may output the data DATA output from the replacement storage unit to the outside of the semiconductor system.

When the first detection signal DET1 is activated, the monitoring unit 730 may detect a utilization rate of a memory bank corresponding to the bank address DET_BA and when the utilization rate satisfies a second condition, the monitoring unit 730 may activate a second detection signal DET2, and when the memory bank corresponding to the bank address DET_BA is the non-replacement bank and the utilization rate satisfies a third condition, the monitoring unit 730 may activate a third detection signal DET3.

The second control unit 720 may control an operation of the memory banks BK0 to BK15 and the replacement storage units BUF0 to BUF3. The second control unit 720 may generate control signals CON_BKs for controlling the memory banks BK0 to BK15 and control signals CON_BUF0s to CON_BUF3s for controlling the replacement storage units BUF0 to BUF3. The control signals CON_BKs for controlling the memory banks BK0 to BK15 may include the control signals for selecting a memory bank, and the control signals for writing data in the memory bank, and the control signals for reading the data of the memory bank. The control signals CON_BUF0s to CON_BUF3s for controlling the replacement storage units BUF0 to BUF3 may include a control signal for selecting the replacement storage unit, the control signals for writing the data in the replacement storage unit, and the control signals for reading the data of the replacement storage unit.

When the second detection signal DET2 is activated, the second control unit 720 may select one replacement storage unit which is not used of the replacement storage units BUF0 to BUF3, and control data of the memory bank corresponding to the bank address DET_BA to be read and transmitted to and written in the selected replacement storage unit. The second control unit 720 may activate the replacement signal REPLACE from the starting time which the data of the memory bank is transmitted to and stored in the replacement storage unit to the completed time of it.

When the third detection signal DET3 is activated, the second control unit 720 may select the replacement storage unit which replaces the memory bank corresponding to the bank address DET_BA, and control the data of the selected replacement storage unit to be read and transmitted to and written in the memory bank corresponding to the bank address DET_BA. The second control unit 720 may activate the restore signal RESTORE from the starting time which the data of the replacement storage unit is transmitted to and stored in the memory bank to the completed time of it.

The second control unit 720 may match the memory bank which is replaced from the starting time of the 'replacement operation' of the memory bank to the completed time of the 'restoration operation' (for example, BK0) and the replacement storage unit which replaces thereto. After the 'replacement operation' is completed, and when a write command to the memory bank BK0 is input in a period which before the 'restoration operation is performed, the second control unit 720 may perform the data is transmitted from the first control unit 710 to be transmitted to and written in the replacement storage unit BUF0, and when a read command is input, the second control unit 720 may perform the data to be read in the replacement storage unit BUF0 and transmitted to the first control unit 710.

When the write command or the read command to the memory bank BK0 is input while the 'replacement operation' and the 'restoration operation are performed, the second control unit 720 may access the replacement storage unit BUF0 referring to each flag information FLAG<0:n> and the address ADDs. The flag information FLAG<0:n> may correspond thereto word lines WL0 to WLn of the memory bank BK0, and when the corresponding word line is in a non-replacement state, the flag information may have a first value, and when the corresponding word line is in a replacement state, the flag information may have a second value. When the flag information of the word line corresponding to the address ADDs is the first value, the second control unit 720 may not access the replacement storage unit BUF0, and when the flag information of the word line corresponding to the address ADDs is the second value, the second control unit 720 may access the replacement storage unit BUF0. The second control unit 720 may output a signal corresponding to the address ADDs among the flag informations FLAG<0:n> as a flag signal FLAG to the first control unit 710.

In the non-replacement state of the word line during the 'replacement operation' may represent a state that the data of the word line is not transmitted to and completely stored in the replacement storage unit, and in the replacement state of the word line during the 'replacement operation' may represent the state that the data of the word line is transmitted to and completely stored in the replacement storage unit. In the non-replacement state of the word line during the 'restoration operation' may represent the state that the data of the replacement storage unit is transmitted to and completely stored in the word line, and in the replacement state of the word line during the 'restoration operation' may represent the state that the data of the replacement storage unit is not transmitted to and completely stored in the word line.

The plurality of the replacement storage units BUF0 to BUF3 may store information which represents whether or not a plurality of word lines WL0-WLn of the memory bank are each in a replaced state with the data is stored in the memory bank which the replacement storage units replace. At this time, when the word line is in the replacement state, the plurality of the replacement storage units BUF0 to BUF3 may store the corresponding information as the first value, and when the word line is in the non-replacement state, the plurality of the replacement storage units BUF0 to BUF3 may store the corresponding information as the second value. When the 'replacement operation' and the 'restoration operation are performed, the plurality of the replacement storage units BUF0 to BUF3 may output the stored information as the flag information FLAG<0:n>.

The data D_BK0 to D_BK15 may represent that the data is input and output from each bank BK0-BK15, and the data D_BUF0-D_BUF3 may represent that the data is input and output from each replacement storage unit BUF0 to BUF3.

The base chip BASE of the semiconductor system in FIG. 2 which is different from the base chip BASE in FIG. 7 may not include the plurality of the replacement storage units BUF0 to BUF3, however the rest configurations and the operation may be the same as the base chip in FIG. 7.

Figure 8:
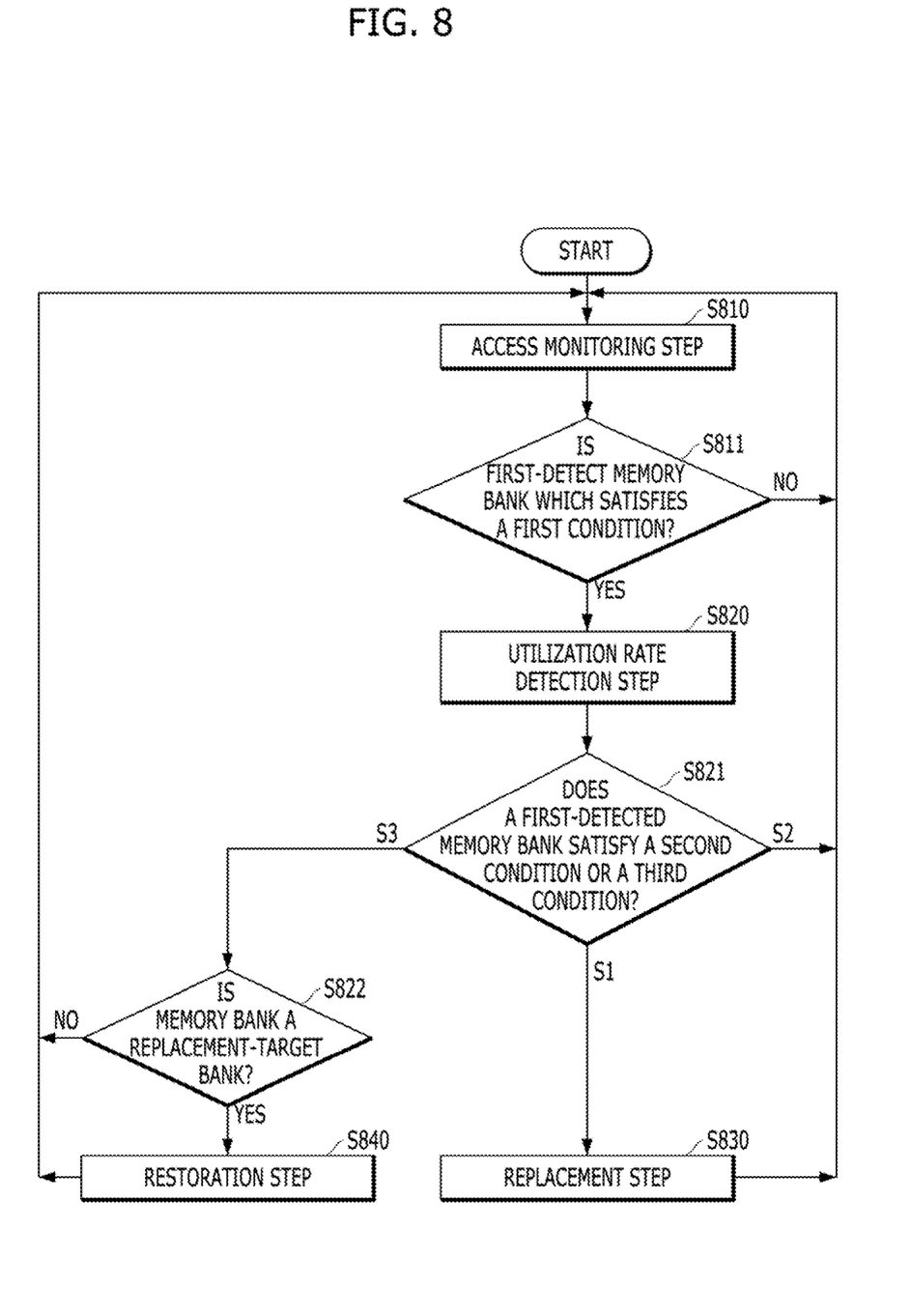
FIG. 8 is a flowchart illustrating an operation method of the semiconductor system in FIG. 2.

FIG. 8 is a flowchart illustrating an operation method of the semiconductor system in FIG. 2.

Referring to FIG. 8, an operation method of the semiconductor system may include an access monitoring step S810, a utilization rate detection step S820, a replacement step S830, and a restoration step S840.

The first control unit 710 may monitor whether or not a plurality of memory banks BK0 to BK15 access at the access monitoring step S810. At the access monitoring step S810, when a memory bank which satisfies a first condition is first detected (YES direction is processed at the S811), the utilization rate detection step S820 is processed, and when the memory bank which satisfies the first condition is not detected (NO direction is processed at the S811), the access monitoring step S810 may be repeated.

At the utilization rate detection step S820, the monitoring unit 730 may detect the utilization rate of the memory bank which is detected by the first control unit 710. When the utilization rate of the memory bank which is detected at the utilization rate detection step S820 satisfies a second condition (S1 direction is processed at the S821), the replacement step S830 may be processed, and when the utilization rate of the memory bank which is detected at the utilization rate detection step S820 does not satisfy all of the second condition and a third condition (S2 direction is processed at the S821), the access monitoring step S810 may be processed, and when the utilization rate of the memory bank which is detected at the utilization rate detection step S820 satisfies the third condition (S3 direction is processed at the S821), the monitoring unit 730 may decide whether or not the corresponding memory bank is a replacement-target bank S822, and then, when the memory bank is the replacement-target bank (YES direction is processed at the S822), the restoration step S840 may be processed, and when the memory bank is not the replacement-target bank (NO direction is processed at the S822), the access monitoring step S810 may be processed.

At the replacement step S830, the data of the memory bank may be transmitted to and stored in the replacement storage unit. At the replacement step S830, when an access command corresponding to the memory bank which is the object of the 'replacement operation' is input, and when a word line corresponding to an address ADDs is in the replacement state, the replacement storage unit may be accessed, and when the word line corresponding to the address ADDs is in the non-replacement state, the word line corresponding to the address ADDs may be accessed.

At the restoration step S840, the data of the memory bank may be transmitted to and stored in the replacement storage unit. At the restoration step S840, when the access command corresponding to the memory bank which is the object of the 'restoration operation' is input, and when the word line corresponding to the address ADDs is in the replacement state, the replacement storage unit may be accessed, and when the word line corresponding to the address ADDs is in the non-replacement state, the word line corresponding to the address ADDs may be accessed.

When the replacement step S830 and the restoration step S840 are completed, the access monitoring step S810 may be processed.

Although various embodiments have been described for illustrative purposes, it will be apparent to those skilled in the art that various changes and modifications may be made without departing from the spirit and scope of the invention as defined in the following claims.

What is claimed is:

1. A semiconductor system comprising:
   one or more core chips including a plurality of memory banks;
   one or more replacement storage units; and
   a base chip suitable for:
   first detecting a memory bank having an access frequency that satisfies a first condition,
   second detecting whether an utilization rate of the first detected memory bank satisfies a second condition, and
   replacing the second detected memory bank with one among the replacement storage units,
   wherein the one or more core chips comprise one or more channels including one or more memory banks among the plurality of memory banks, and the one or more channels are independently controlled, and
   wherein the base chip is suitable for setting a channel that all the included memory banks are replaced with the replacement storage units among the one or more channels to a power down mode.

2. The semiconductor system of claim 1, wherein the first condition is a condition in which the access frequency is greater than a reference access frequency.

3. The semiconductor system of claim 1, wherein the first condition is a condition in which the access frequency is less than a reference access frequency.

4. The semiconductor system of claim 1, wherein the second condition is a condition in which the utilization rate of the first detected memory bank is greater than a replacement utilization threshold rate.

5. The semiconductor system of claim 1, wherein the second condition is a condition in which the utilization rate of the first detected memory bank is less than a replacement utilization threshold rate.

6. The semiconductor system of claim 1, wherein each of the plurality of memory banks comprise a plurality of word lines, and
   the utilization rate of the first detected memory bank is a ratio of the number of word lines in a used state over the total number of the plurality of word lines of the first detected memory bank.

7. The semiconductor system of claim 1, wherein the base chip is suitable for monitoring whether or not the plurality of memory banks in one or more core chips are accessed, and is suitable for performing the first detection using a monitoring result.

8. The semiconductor system of claim 1, wherein the base chip is suitable for controlling data of the second detected memory bank to be transmitted to and stored in the replacement storage unit.

9. The semiconductor system of claim 1, wherein if the access command to the second detected memory bank is inputted while the data of the second detected memory bank is transmitted to and stored in the replacement storage unit, the base chip is suitable for controlling the replacement storage unit to be accessed when a word line which is an object of an access command is in a replacement state that all the data of the word lines are stored in the replacement storage unit and suitable for controlling the second detected memory bank to be accessed when the word line which is the object of the access command is in a non-replacement state that all the data of the word lines are not stored in the replacement storage unit.

10. The semiconductor system of claim 9, wherein the base chip is suitable for controlling a transmission and storage of the data to be performed at the latency time corresponding to the access command when the access command to the second detected memory bank is inputted while the data of the second detected memory bank is transmitted to and stored in the replacement storage unit.

11. The semiconductor system of claim 1, wherein the base chip is suitable for accessing the replacement storage unit which replaces a first memory bank or suitable for interrupting the access command in response to an access command, which includes one or more commands among an active command, a precharge command, a refresh command, a write command and a read command, corresponding to a replacement-target bank which is replaced with the replacement storage unit among the plurality of memory banks.

12. The semiconductor system of claim 11, wherein the base chip is suitable for interrupting the access command when the access command is the active command, the precharge command or the refresh command, and suitable for accessing the replacement storage units which replaces the replacement-target bank when the access command is the write command or the read command.

13. The semiconductor system of claim 1, wherein the base chip is suitable for third-detecting whether or not a first detected replacement-target bank satisfies a third condition when the first detected memory bank is a replacement-target bank, and suitable for restoring the replacement storage units which replaces a third-detected replacement-target bank to the third-detected replacement-target bank.

14. The semiconductor system of claim 13, wherein the third condition is a condition in which the utilization rate of the first detected replacement-target bank has to be greater than a restoration utilization threshold rate.

15. The semiconductor system of claim 13, wherein the third condition is a condition in which the utilization rate of the first detected replacement-target bank has to be less than a restoration utilization threshold rate.

16. The semiconductor system of claim 13, wherein the base chip is suitable for controlling data of the replacement storage units which replaces the third-detected replacement-target bank to be transmitted to and stored in the third-detected replacement-target bank.

17. The semiconductor system of claim 13, wherein if the access command to the third-detected replacement-target bank is input while data of the replacement storage units which replaces the third-detected replacement-target bank is transmitted to and stored in the third-detected replacement-target bank, the base chip is suitable for controlling the replacement storage units to be accessed when a word line which is an object of an access command is in a replacement state that all the data of the word lines are stored in the replacement storage units and suitable for controlling the third-detected replacement-target bank to be accessed when the word line which is the object of the access command is in a non-replacement state that all the data of the word lines are not stored in the replacement storage units.

18. The semiconductor system of claim 17, wherein the base chip is suitable for controlling a transmission and storage of the data to be performed at the latency time corresponding to the access command when the access command to the third-detected replacement-target bank is input while the data of the replacement storage units which replaces the third-detected replacement-target bank is transmitted to and stored in the third-detected replacement-target bank.

19. The semiconductor system of claim 1, wherein the base chip comprises:
a first control unit suitable for generating one or more control signals by receiving an access command, suitable for transmitting the one or more control signals to the one or more core chips, and suitable for monitoring whether or not the plurality of memory banks in the one or more core chips are accessed;
a second control unit suitable for controlling data transmitting between the one or more replacement storage units and the plurality of memory banks in the one or more core chips, and between the one or more replacement storage units and the first control unit; and
a monitoring unit suitable for performing the first detecting by monitoring whether or not the plurality of memory banks in the one or more core chips are accessed and, and performing the second detecting by monitoring the utilization rate.

20. The semiconductor system of claim 1, wherein the one or more replacement storage units are included in the base chip.

21. The semiconductor system of claim 1, further comprising a replacement chip connected to the base chip,
wherein the one or more replacement storage units are included in the replacement chip.

22. A method of operating a semiconductor system comprising:
detecting a first memory bank having an access frequency that satisfies a first condition in one or more core chips including a plurality of memory banks, and of which an utilization rate satisfies a second condition in the plurality of memory banks, by a base chip connected to the core chips;
replacing the first memory bank with one or more replacement storage units;
detecting the replacement storage units of which the utilization rate satisfies a third condition; and
restoring the replacement storage units to the first memory bank,
wherein the base chip is for controlling data of the first memory bank to be transmitted to and stored in the replacement storage units, and
wherein the base chip is for controlling data of the replacement storage units to be transmitted to and stored in the first memory bank.

23. The method of claim 22, wherein the first condition is a condition in which the access frequency has to be less than a reference access frequency,
and wherein the second condition is a condition in which the utilization rate has to be less than a replacement utilization threshold rate.

24. The method of claim 22, wherein the one or more replacement storage units are in the base chip.

25. The method of claim 22, wherein the third condition is a condition in which the utilization rate has to be greater than a restoration utilization threshold rate.

* * * * *